US008837758B2

(12) United States Patent
Knudsen

(10) Patent No.: US 8,837,758 B2
(45) Date of Patent: Sep. 16, 2014

(54) HEARING AID AND METHOD OF DRIVING AN OUTPUT STAGE

(71) Applicant: Widex A/S, Lynge (DK)

(72) Inventor: Niels Ole Knudsen, Humlebak (DK)

(73) Assignee: Widex A/S, Lynge (DK)

( * ) Notice: Subject to any disclaimer, the term of this patent is extended or adjusted under 35 U.S.C. 154(b) by 23 days.

(21) Appl. No.: 13/845,868

(22) Filed: Mar. 18, 2013

(65) Prior Publication Data

US 2013/0216076 A1 Aug. 22, 2013

Related U.S. Application Data

(63) Continuation-in-part of application No. PCT/EP2011/052890, filed on Feb. 28, 2011.

(51) Int. Cl.
*H04R 25/00* (2006.01)
*H03F 3/217* (2006.01)

(52) U.S. Cl.
CPC .............. *H04F 25/30* (2013.01); *H04R 25/558* (2013.01); *H03F 3/2173* (2013.01); *H04R 2460/03* (2013.01); *H04R 2225/49* (2013.01)
USPC .......................................... 381/312; 381/314

(58) Field of Classification Search
CPC ... H04R 25/00; H04R 25/505; H04R 2225/61
USPC .................................................. 381/312, 314
See application file for complete search history.

(56) References Cited

U.S. PATENT DOCUMENTS

2007/0036375 A1* 2/2007 Jensen ........................... 381/312
2011/0249836 A1* 10/2011 Solum et al. .................. 381/314

FOREIGN PATENT DOCUMENTS

| AU | 2008202727 A1 | 1/2009 |
| EP | 1716723 B1 | 11/2008 |
| EP | 2012509 A1 | 1/2009 |
| WO | 03/047309 A1 | 6/2003 |
| WO | 2009/062500 A1 | 5/2009 |

OTHER PUBLICATIONS

International Search Report with Written Opinion for PCT/EP2011/052890 dated Oct. 20, 2011.

* cited by examiner

*Primary Examiner* — Ahmad Matar
*Assistant Examiner* — Katherine Faley
(74) *Attorney, Agent, or Firm* — Sughrue Mion, PLLC

(57) ABSTRACT

In a hearing aid (40), a direct-digital H-bridge output driver stage (1) driven by a sigma-delta modulator (2) is configured to operate in a power-saving three-level output mode or a power-consuming two-level output mode. The three-level output mode of the H-bridge output driver stage (1) has low power consumption but suffers the disadvantage of emitting capacitive noise potentially interfering with the reception of radio signals in a radio receiver (17) in the hearing aid (40). By providing a novel method of selecting the two-level output mode whenever the radio receiver (17) is receiving signals, and selecting the three-level output mode whenever the radio receiver (17) is idle, this capacitive interference does not disturb the radio receiver (17) in the hearing aid (40). The invention provides a method and a hearing aid.

11 Claims, 4 Drawing Sheets

HEARING AID AND METHOD OF DRIVING AN OUTPUT STAGE

RELATED APPLICATIONS

The present application is a continuation-in-part of application PCT/EP2011052890, filed on 28 Feb. 2011, in Europe, and published as WO 2012116721 A1.

BACKGROUND OF THE INVENTION

1. Field of the Invention

This application relates to hearing aids. More specifically, it relates to a method for driving a digital output stage of a hearing aid. It also relates to a hearing aid configured for employing the method.

In this context, a hearing aid is defined as a small, battery-powered device, comprising a microphone, an audio processor and an acoustic output transducer, configured to be worn in or behind the ear by a hearing-impaired person. By fitting the hearing aid according to a prescription calculated from a measurement of a hearing loss of the user, the hearing aid may amplify certain frequency bands in order to compensate the hearing loss in those frequency bands. In order to provide an accurate and flexible amplification, most modern hearing aids are of the digital variety.

Contemporary digital hearing aids incorporate a digital signal processor for processing audio signals from the microphone into electrical signals suitable for driving the acoustic output transducer according to the prescription. In order to save space and improve efficiency, some digital hearing aid processors use a digital output signal to drive the acoustic output transducer directly without performing a digital-to-analog conversion of the output signal. If the digital signal is delivered to the acoustic output transducer directly as a digital bit stream with a sufficiently high frequency, the coil of the acoustic output transducer performs the duty as a low-pass filter, allowing only frequencies below e.g. 15-20 kHz to be reproduced by the acoustic output transducer. The digital output signal is preferably a pulse width modulated signal, a sigma-delta modulated signal, or a combination thereof.

The most recent generations of hearing aids also incorporate a tiny radio receiver for the purpose of receiving radio signals intended for the hearing aid circuitry. Typical uses of such a radio receiver are remote controlling volume and program settings from a wireless remote control carried around by the hearing aid user, streaming of audio signals from an external source such as a television set, a compact disc player or a mobile telephone, wireless programming of the hearing aid by a hearing aid fitter according to a prescription, thus eliminating the need for cumbersome wires and fault-prone electrical contacts between the fitting equipment and the hearing aid, or synchronization signals from another hearing aid. The radio receivers employed for this purpose must be physically small, have modest power requirements, and perform reliably within the intended range of the transmitter used.

An H-bridge is an electronic circuit for controlling inductive loads such as electric motors or loudspeakers. It operates by controlling the direction of a flow of current through a load connected between the output terminals of the H-bridge by opening and closing a set of electronic switches present in the H-bridge. The switches may preferably be embodied as semiconductor switching elements such as BJT transistors or MOSFET transistors. This operating principle permits a direct digital drive output stage to be employed in order to enable a suitably conditioned digital signal to drive a loudspeaker directly, thus eliminating the need for a dedicated digital-to-analog converter and at the same time reducing the power requirements for the output stage.

A sigma-delta modulator is an electronic circuit for converting a signal into a bit stream. The signal to be converted may be digital or analog, and the sigma-delta modulator is typically used in applications where a signal of a high resolution is to be converted into a signal of a lower resolution. In this context, a sigma-delta modulator is used for driving the H-bridge output stage in the hearing aid.

The diaphragm of a loudspeaker has a resting or neutral position assumed whenever no current flows through the loudspeaker coil and two extreme positions assumed whenever the maximal allowable current flows in either direction through the loudspeaker. By applying a sufficiently fast-changing bit stream from an H-bridge represented by positive and negative voltage impulses to the loudspeaker terminals, any position between the two extreme diaphragm positions of the loudspeaker may be attained. The higher the number of positive impulses in the bit stream is, the more the loudspeaker diaphragm will move towards the first extreme position, and the higher the number of negative impulses in the bit stream is, the more the loudspeaker diaphragm will move towards the second extreme position. Due to the low-pass filtering effect of the loudspeaker coil, no audible switching noise will emanate from the loudspeaker when driven in this way, provided the switching period of the bit stream is well above the reproduction frequency limit of the loudspeaker. Thus, a digital bit stream may control a loudspeaker directly.

2. The Prior Art

Digital radio receivers, such as the kind disclosed in WO-A1-09/062500, are especially useful, as they require very little power while maintaining a comparatively high selectivity in the reception. Other types of radio receivers may be employed, but the limited power available in a hearing aid puts a severe restriction on the selectivity, and, as a consequence, the obtainable range and reliability of the radio receiver. A remote control transmitter for use with a hearing aid has a desirable range of approximately one meter while an internal transmitter in another hearing aid has a desirable range of roughly thirty centimeters. The remote control transmitter is capable of issuing various commands to the hearing aid such as program selection and volume control, and also of performing streaming of a digitally represented audio signal to the hearing aid, thus being highly dependent on the existence of a reliable transmission link from the transmitter to the receiver. A pair of hearing aids having a set of transmitters and receivers may have the capability to exchange central parameters relating to the signal processing in the hearing aids apart from program selections and volume settings. This capability is also dependent on the presence of a reliable transmission link between the two hearing aids.

From EP-B1-1716723 is known a digital output stage for a hearing aid, said output stage comprising a sigma-delta converter and an H-bridge for driving an acoustic output transducer for a hearing aid. The output stage is denoted a three-level output stage because it is capable of delivering a bit stream consisting of three individual signal levels to the acoustic output transducer. In the following, these levels are denoted "+1", "−1" and "0", where "+1" equals the maximum positive voltage across the acoustic output transducer, "−1" equals the maximum negative voltage across the acoustic output transducer, and "0" equals no voltage. This utilizes the fact that a positive voltage pulse makes the diaphragm of the acoustic output transducer move in one direction, and a negative voltage pulse makes the diaphragm of the acoustic output transducer move in the other direction. By delivering a clocked bit stream consisting of "+1"-levels and "−1"-levels interspersed with "0"-levels as voltage pulses to the acoustic output transducer, any position deviation within the confinements of the mechanical suspension of the acoustic output transducer diaphragm may thus be obtained, as the loudspeaker coil acts as an integrator of the voltage pulses. The digital output stage of the prior art generates the "0"-level by applying a "+1"-level and a "−1"-level simultaneously to both terminals of the acoustic output transducer.

This way of generating the "0"-level for the acoustic output transducer has the advantages of being very easy to implement, as no extra components are needed to provide the "0"-level, and to save power, as the "0"-level uses no extra current and the provision of three separate levels effectively doubles the possible voltage swing across the acoustic output transducer. However, it also has some inherent drawbacks, which will be explained in greater detail in the following.

The "+1"-levels and "−1"-levels both generate differential voltages over the wires and terminals of the acoustic output transducer. This is not the case with the "0"-level. With the "0"-level, both wires carry the same voltage simultaneously, and since this is a voltage rapidly switching between the "+1"-level and "−1"-level it radiates more common mode signal energy to its immediate surroundings. This radiation results in increased crosstalk to nearby circuitry such as telecoils or wireless transmission receiver coils typically present in the hearing aid. Since this crosstalk has frequencies above 1 MHz, it does not possess a problem to a nearby telecoil, which may usually be found in a hearing aid, since a telecoil is configured to convey frequencies below 8-10 kHz. A wireless receiver coil, however, inevitably suffers a very considerable reduction in its signal-to-noise ratio from the capacitive interference signal induced by this crosstalk phenomenon, often to a degree where reliable signal reception becomes impossible.

This capacitive interference emanates mainly from electrically exposed parts of the output circuit, primarily the wires connecting the output pads of the electronic circuit chip of the hearing aid to the input terminals of the acoustic output transducer. It is not possible to shorten these wires further for mechanical reasons, but some reduction in the capacitive coupling between these wires and sensitive electronic circuits in the vicinity may be achieved by twisting the wires and keeping them physically close together.

The voltage pulses from the H-bridge output stage of the hearing aid are essentially presented to the output transducer as a square wave signal having a frequency of 1-2 MHz, and the resulting switching noise components from the "0"-levels generated in this manner may thus disturb the operation of electronic circuits sensitive to capacitive interference in this frequency range, such as a radio receiver. In cases where the afflicted electronic equipment incorporates a wireless remote control receiver in the hearing aid the problems caused by electromagnetic interference are exceptionally severe, as the effective operating range of the wireless remote control is limited considerably by the capacitive interference emanating from the output stage, excluding the remote control signals from proper reception.

WO-A1-03/047309 discloses a digital output driver circuit for driving a loudspeaker for a mobile device such as a hearing aid or a mobile phone. The digital driver circuit comprises an input, a modulator and a three-level H-bridge and is integrated into the loudspeaker enclosure in order to shield the driver circuit from electromagnetic interference and to keep the wires connecting the driver output to the loudspeaker short. The driver circuit further comprises a feedback circuit connected to the loudspeaker for regulating the supply voltage for the driver circuit.

An output driver integrated into a loudspeaker, such as described by the teachings of WO-A1-03/047309, is not interchangeable with dynamic standard loudspeakers of the kind used in hearing aids. If, for example, a hearing aid housing and circuitry may be adapted for use with a range of different loudspeakers having different impedance values, e.g. for treating different degrees of hearing loss, a loudspeaker having an integrated output driver would not be well suited for this configuration. Hearing aids configured for being used with receiver-in-the-ear (RITE) loudspeakers would also be impractical to implement using this method. In cases where this type of flexibility is desired, long wires between the output stage terminals of the hearing aid circuit and the terminals of the loudspeaker of the hearing aid are unavoidable. An extra set of long wires for the signal from the loudspeaker to the feedback circuit would also be required by the prior art output driver, which would further increase the capacitive interference noise.

The invention, in a second aspect, provides a method of driving an output stage for a hearing aid, said hearing aid having at least one input transducer, an analog-to-digital converter, a digital signal processor, a sigma-delta modulator, a first quantizing block, a second quantizing block, a decoder, an H-bridge output converter, an acoustic output transducer, a timer, a controller and a radio receiver, the radio receiver having an idle mode of operation and a listening mode of operation, said method comprising the steps of generating a driving signal in the sigma-delta modulator based on an output signal from the digital signal processor, processing, in the first quantizing block, using the sigma-delta modulator output signal to generate a first bit stream adapted for defining two discrete levels, processing, in the second quantizing block, using the sigma-delta modulator output signal to generate a second bit stream adapted for defining three discrete levels, the controller using the timer to execute a control sequence for enabling the decoder to select one bit stream among the first and the second bit streams and control the operating mode of the radio receiver, the decoder selecting the first bit stream whenever the radio receiver is in the listening mode, the decoder selecting the second bit stream whenever the radio receiver is in the idle mode, and providing a drive signal for the H-bridge output converter based on the selected bit stream.

This method of driving an output stage of the H-bridge variety for a hearing aid achieves that the power efficiency of an output stage operating with three levels is maintained as closely as possible while minimizing the problems caused by the interference also associated with a three-level output stage.

By taking the operating mode of the radio receiver into account when selecting the operating mode of the sigma-delta modulator, the H-bridge output converter is driven in a three-level mode whenever the radio receiver is in the idle mode, i.e. when it is not receiving any signals. In this case, power consumption is reduced by driving the H-bridge output converter in a three-level mode. Whenever the radio receiver is in the listening mode, the H-bridge output converter is driven in a two-level mode. In this case, the power consumption is increased somewhat, but the interference associated with driving the H-bridge output converter in the three-level mode is reduced.

In a preferred embodiment, the controller enables the radio receiver to enter the listening mode periodically, e.g. twenty times per second, in turn causing the H-bridge output converter to operate in the two-level mode for the duration the radio receiver is in the listening mode. The duration of the listening mode period may be relatively short, e.g. ten milliseconds, unless the radio receiver detects a radio signal within the listening mode period. Otherwise, the radio receiver may reenter the idle mode, in turn causing the H-bridge output converter to operate in the three-level mode again. However, if the radio receiver detects the presence of a radio signal within the listening mode period, reentrance by the radio receiver to the idle mode is suppressed until no radio signal has been detected for the duration of a predetermined period, e.g. a tenth of a second. Then the radio receiver reenters the idle mode, thus forcing the H-bridge output converter to operate in the three-level mode again.

The invention, in a second aspect, provides a hearing aid having at least one input transducer, an analog-to-digital converter, a digital signal processor, a sigma-delta modulator, a first quantizing block, a second quantizing block, a decoder, an H-bridge output converter, an acoustic output transducer, a timer, a controller and a radio receiver, the radio receiver having an idle mode of operation and a listening mode of operation, the sigma-delta modulator being adapted for generating a driving signal based on an output signal from the digital signal processor, the first quantizing block being adapted for generating a first bit stream and the second quantizing block being adapted for generating a second bit stream based on the sigma-delta modulator output signal, the first bit stream incorporating two discrete levels and the second bit stream incorporating three discrete levels, the controller being adapted for enabling the decoder to select one bit stream among the first and the second bit streams and for controlling the operating mode of the radio receiver, wherein said controller is configured to make the decoder select the first bit stream whenever the radio receiver is in the listening mode, and make the decoder select the second bit stream whenever the radio receiver is in the idle mode.

Additional features will appear from the dependent claims.

BRIEF DESCRIPTION OF THE DRAWINGS

The invention will now be explained in greater detail with respect to the drawings, where.

DETAILED DESCRIPTION

Figure 1:
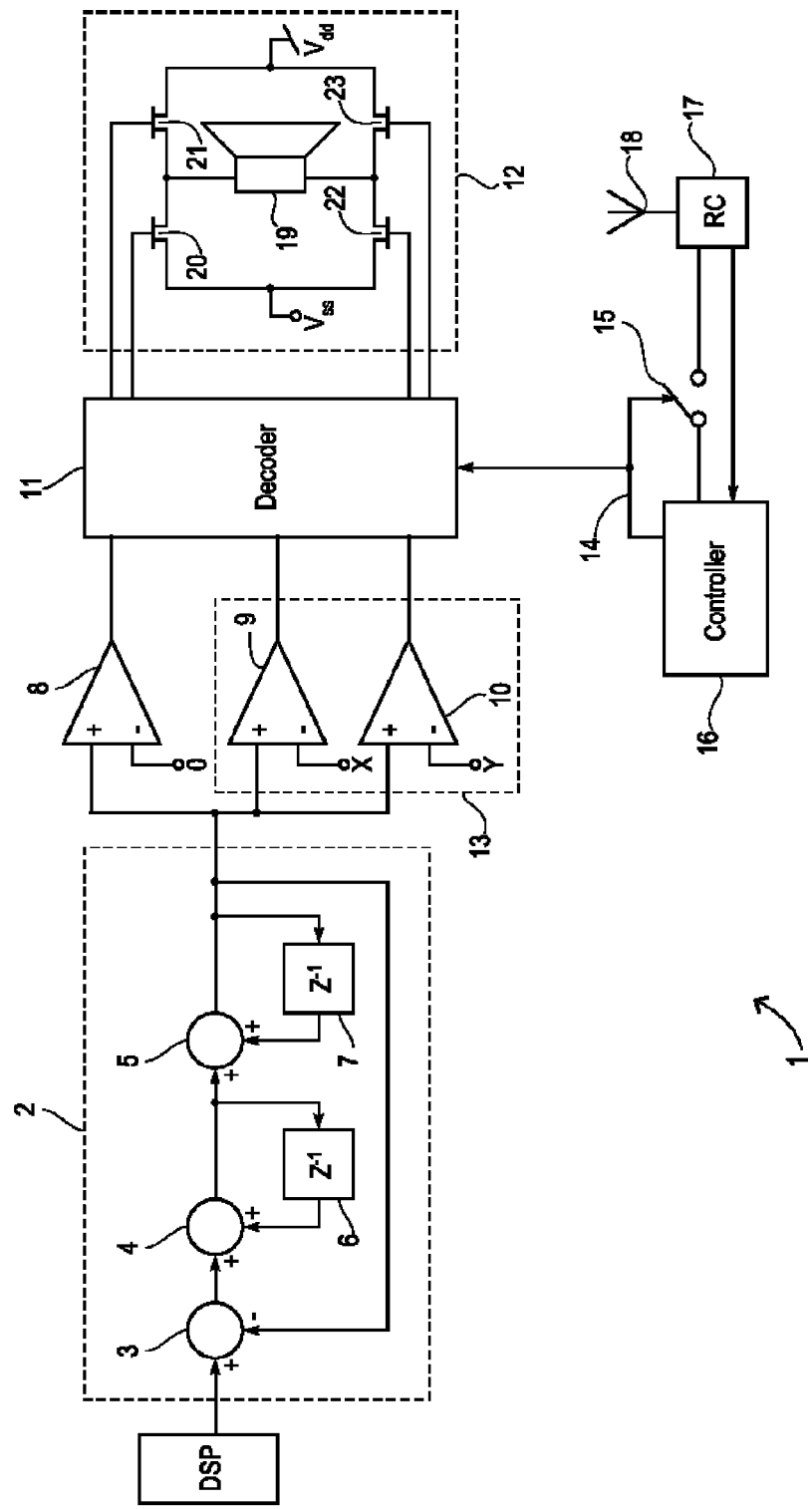
FIG. 1 is a schematic of an H-bridge output stage for a hearing aid according to an embodiment of the invention.

The schematic in FIG. 1 shows an output stage 1 for use with a hearing aid according to the invention. The output stage comprises a sigma-delta modulator 2, a first comparator 8 constituting a first quantizer, a second quantizer 13 comprising a second comparator 9 and a third comparator 10, a decoder 11, an H-bridge 12, a controller 16, a control wire 14, a controlled switch 15, a radio receiver 17, an antenna 18 and an acoustic output transducer 19. The sigma-delta modulator 2 comprises a difference node 3, a first summing node 4, a second summing node 5, a first unit delay block 6 and a second unit delay block 7. The H-bridge comprises a first transistor 20, a second transistor 21, a third transistor 22, and a fourth transistor 23. Also shown in FIG. 1 is an output terminal from a digital signal processor DSP of the hearing aid.

The output terminal of the digital signal processor DSP is connected to the input of the sigma-delta converter 2. The output terminal of the digital signal processor DSP is connected to a first input of the difference node 3 of the sigma-delta converter 2, and a feedback loop from the output of the sigma-delta converter 2 is connected to a second input of the difference node 3. The output of the difference node 3 is connected to a first input of the first summing node 4, and the output of the first unit delay block 6 is connected to a second input of the first summing node 4. The output of the first summing node 4 is split between an input of the first unit delay block 6 and a first input of the second summing node 5. An output of the second unit delay block 7 is connected to a second input of the second summing node 5, and the output of the second summing node 5 is split between an input of the second unit delay block 7, the feedback loop feeding the difference node 3, and the positive inputs of the first comparator 8, the second comparator 9 and the third comparator 10, respectively.

The output of the sigma-delta modulator 2 is connected to the positive input terminals of the first comparator 8, the second comparator 9, and the third comparator 10, respectively. The negative input terminal of the first comparator 8 is connected to logical LOW, the negative input terminal of the second comparator 9 is connected to the logical level X, and the negative input terminal of the third comparator 10 is connected to the logical level Y. The output of the first quantizer 8 is connected to a first input of the decoder 11, and the outputs of the second quantizer 13 are connected to a second and a third input of the decoder 11. Based on the output signal from the sigma-delta modulator 2, the first quantizer 8 is capable of generating two different quantization levels and the second quantizer 13 is capable of generating three different quantization levels.

A first output of the decoder 11 is connected to the first transistor 20 of the H-bridge 12, a second output of the decoder 11 is connected to the second transistor 21 of the H-bridge 12, a third output of the decoder 11 is connected to the third transistor 22 of the H-bridge 12, and a fourth output of the decoder 11 is connected to the fourth transistor 23 of the H-bridge 12. The source terminals of the first transistor 20 and the third transistor 22 are connected to $V_{ss}$. The drain terminal of the first transistor 20 and the source terminal of the second transistor 21 are connected to a first terminal of the acoustic output transducer 19. The drain terminal of the third transistor 22 and the source terminal of the fourth transistor 23 are connected to a second terminal of the acoustic output transducer 19, and the drain terminals of the second transistor 21 and the fourth transistor 23 are connected to $V_{dd}$.

The control wire 14 of the controller 16 is connected to the control input of the controlled switch 15 and to a control input of the decoder 11, respectively. The controlled switch 15 connects an output of the radio receiver 17 to an input of the controller 16, disabling this connection whenever the controlled switch 15 is open. A signaling wire connects the radio receiver 17 to the controller 16 for providing data based on radio signals picked up by the antenna 18 and demodulated by the radio receiver 17 to the controller 16.

When in use, the digital signal processor DSP provides a bit stream representing an audio signal to the input of the sigma-delta modulator 2. The bit stream is conditioned by the sigma-delta modulator 2 in order to suit the inputs of the first comparator 8, the second comparator 9 and the third comparator 10, respectively. The first comparator 8 acts as a first two-level quantizer on the output signal from the sigma-delta modulator 2, and the second comparator 9 and the third comparator 10 in combination act as a second three-level quantizer 13 on the output signal from the sigma-delta modulator 2.

The first comparator 8 outputs a logical LOW level whenever the level of the output signal from the sigma-delta modulator 2 is below a first, predetermined limit and a logical HIGH level whenever the signal is above said first, predetermined limit. The second comparator 9 outputs a logical LOW level whenever the input signal is below the limit X and a logical HIGH level whenever the input signal is above the limit X. The third comparator 10 outputs a logical LOW level whenever the input signal is below the limit Y and a logical HIGH level whenever the input signal is above the limit Y.

Together, the second comparator 9 and the third comparator 10 may thus generate four possible levels for the decoder 11. However, only three of these levels are utilized in the decoder 11, as the condition where the output of the second comparator 9 is logical HIGH and the output of the third comparator 10 is logical LOW is treated equally to the condition where the output of the second comparator 9 is logical LOW and the output of the third comparator 10 is logical HIGH. The three conditions may be interpreted by the decoder 11 as e.g. the symbol "−1" for input levels resulting in both comparator outputs being logical LOW, the symbol "0" for input levels resulting in the two comparator outputs being mutually different, i.e. one comparator output is logical LOW while the other comparator output is logical HIGH, and the symbol "+1" for input levels resulting in both comparator outputs being logical HIGH. In this way, the first quantizer 8 effectively generates two discrete levels from the input signal from the sigma-delta modulator 2, and the second quantizer 13 effectively generates three discrete levels from the input signal from the sigma-delta modulator 2.

The decoder 11 is capable of selecting either the two-level output from the first quantizer 8 or the three-level output from the second quantizer 13 as the input signal to be decoded. The decoder 11, together with the H-bridge 12, is capable of driving the loudspeaker 19 in a two-level mode of operation whenever the output signal from the first quantizer 8 is selected as the input signal, and in a three-level mode of operation whenever the output signal from the second quantizer 13 is selected as the input signal.

The decision about which output to use as an input of the decoder 11 is determined by the state of the control wire 14 of the controller 16. The control wire 14 may be in an asserted state or in an unasserted state, respectively. Whenever the control wire 14 is in the asserted state, the decoder 11 uses the output signal from the two-level output of the first quantizer 8 as its input signal. Asserting the control wire 14 also closes the switch 15, thereby enabling the radio receiver 17 to receive radio signals via the antenna 18. Whenever the radio receiver 17 is enabled to receive radio signals, information about the presence of a radio signal is conveyed to the controller 16 through a separate wire (not shown). Whenever the control wire 14 is in the unasserted state, the decoder 11 uses the output signal from the three-level output of the second quantizer 13 as its input signal. Unasserting the control wire 14 also opens the switch 15, thereby disabling the radio receiver 17 from receiving radio signals.

Whenever the decoder 11 receives a "−1"-symbol for decoding, it turns on the second transistor 21 and the third transistor 22, respectively, of the H-bridge 12. The second transistor 21 connects the upper terminal of the acoustic output transducer 19 to the positive voltage $V_{dd}$, and the third transistor 22 connects the lower terminal of the acoustic output transducer to the negative voltage $V_{ss}$, and the loudspeaker membrane moves inwards.

Whenever the decoder 11 receives a "+1"-symbol for decoding, it turns on the first transistor 20 and the fourth transistor 23, respectively, of the H-bridge 12. The first transistor 20 connects the upper terminal of the acoustic output transducer 19 to the negative voltage $V_{ss}$, and the fourth transistor 23 connects the lower terminal of the acoustic output transducer to the positive voltage $V_{dd}$, and the loudspeaker membrane moves outwards.

Whenever the decoder 11 receives a "0"-symbol for decoding, it turns on the second transistor 21 and the fourth transistor 23, respectively, of the H-bridge 12. Both the second transistor 21 and the third transistor 22 then connect the upper terminal and the lower terminal of the acoustic output transducer 19 to the negative voltage $V_{ss}$, and the loudspeaker membrane moves towards its resting position.

The controller 16 coordinates the quantization resolution of the output signal from the sigma-delta modulator 2 with the operation of the radio receiver 17 in such a way that the radio receiver 17 is disabled whenever the decoder 11 is using the three-level input for controlling the H-bridge 12, and in such a way that the radio receiver 17 is enabled whenever the decoder 11 is using the two-level input for controlling the H-bridge 12.

Figures 2, 3:
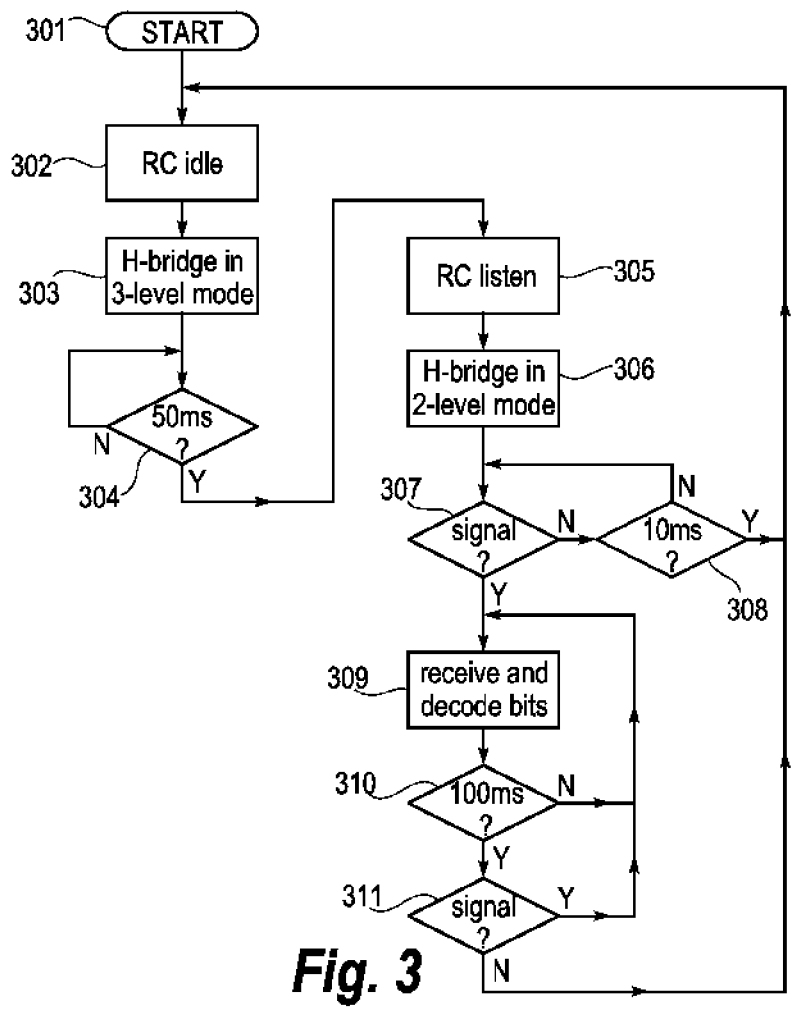
FIG. 2 is a table showing possible states of the H-bridge output stage of the hearing aid according to an embodiment of the invention.
FIG. 3 is a flowchart of an algorithm for controlling the operating modes according to an embodiment of the invention.

The table shown in FIG. 2 illustrates the possible states of the connecting wires of an acoustic output transducer similar to the acoustic output transducer 19 in FIG. 1 when connected to the H-bridge output stage of the hearing aid according to an embodiment of the invention. Beside the table is sketched an acoustic output transducer having connecting terminals A and B. In the configuration of a preferred embodiment of the hearing aid according to the invention, a sigma-delta converter together with a first quantizer, a second quantizer and a decoder may generate either two or three different output symbols intended for the H-bridge output stage of the hearing aid.

When the symbol "−1" is generated, the H-bridge output stage connects the terminal A of the acoustic output transducer to a negative voltage, preferably the negative battery voltage, denoted $V_{dd}$, and the terminal B of the acoustic output transducer to a positive voltage, preferably the positive battery voltage, denoted $V_{ss}$. This induces an electromotive force in the transducer coil of the acoustic output transducer in the direction from terminal B to terminal A, and a transducer membrane mechanically connected to the transducer coil will thus move in one direction, say, inwards.

When the symbol "+1" is generated, the H-bridge output stage connects the terminal A of the acoustic output transducer to the positive battery voltage $V_{ss}$, and the terminal B of the acoustic output transducer to the negative battery voltage $V_{dd}$. This induces an electromotive force in the transducer coil of the acoustic output transducer in the opposite direction, i.e. from terminal A to terminal B, and the transducer membrane will thus move in the opposite direction, say, outwards.

When the symbol "0" is generated, the H-bridge output stage connects both the terminal A and the terminal B of the acoustic output transducer to the negative battery voltage $V_{dd}$. No electromotive force is induced in the transducer coil of the acoustic output transducer in this case, and the transducer membrane will thus move towards its resting position.

When the H-bridge is put into two-level mode, the symbol "0" is not generated. The switching between two-level mode and three-level mode is beneficially performed in the decoder. By changing the quantization resolution of the output signal from the sigma-delta modulator from two levels to three levels, or vice versa, in the decoder, the feedback history of the sigma-delta modulator is preserved in its entirety. As shown in FIG. 1, this may be performed by the decoder having both the two-level and the three-level quantization resolution available at all times, and selecting the appropriate quantization resolution for driving the output for the acoustic output transducer of the hearing aid as necessary. The fact that the feedback history of the sigma-delta modulator is preserved in its entirety implies that switching between the two-level mode and the three-level mode of the sigma-delta modulator is performed seamlessly with regard to the output signal to the acoustic output transducer without any audible artifacts.

An easy way of providing both a two-level modulation and a three-level modulation of the bit stream could be to employ two separate sigma-delta modulators. If a two-level sigma-delta modulator in parallel with a three-level sigma-delta modulator were used instead of a single sigma-delta modulator having both two-level and three-level capability, the feedback history of the sigma-delta modulator would be lost every time a transition from the two-level mode to the three-level mode, or vice versa, were made. This configuration would inevitably introduce undesirable, spurious transients into the output signal. By introducing a single sigma-delta modulator capable of selectively producing both a two-level and a three-level modulation of the output bit stream, the feedback history of the output stage is preserved when switching between different quantizing resolutions.

In FIG. 3 is shown a flowchart illustrating a preferred control algorithm for a radio receiver and an H-bridge output stage of the hearing aid according to the invention. The timing values used by the algorithm in FIG. 3 are calculated and detected by an external subroutine, and are thus not shown. Only the timing flags are passed implicitly to the algorithm shown in FIG. 3 based on the timing values encountered by the system. The algorithm, initiating in step 301, continues immediately to step 302, where the radio receiver is put into an idle mode. The algorithm sets the H-bridge output stage in a three-level mode in step 303 and enters a loop in step 304. In step 304, the algorithm determines if fifty milliseconds have elapsed since the radio receiver was last put into the idle mode. If this is not the case, the algorithm loops back into step 304 until the fifty milliseconds have elapsed, and continues to step 305, where the radio receiver is put into a listening mode. The algorithm then continues unconditionally to step 306, where the H-bridge output stage is put into a two-level mode.

The algorithm continues in step 307, where an indicator in the radio receiver informs the algorithm if a radio signal is present. If this is not the case, the algorithm branches out into a test, carried out in step 308, to determine if ten milliseconds have elapsed since the radio receiver were put into the listening mode without detecting a signal. If ten milliseconds have not yet elapsed, the algorithm loops back into step 307 in order to test if a radio signal has been picked up yet by the radio receiver. Otherwise, if ten milliseconds have elapsed without the radio receiver detecting the presence of a radio signal, the algorithm loops back into step 302, where the radio receiver is put back into the idle mode, and continues unconditionally into step 303, where the H-bridge is put back into the three-level mode and the procedure of the algorithm is repeated indefinitely.

If, however, a radio signal is indeed detected by the radio receiver while the algorithm is processing step 307, the algorithm instead continues into step 309, where a subroutine (not shown) is called for carrying out the process of decoding the data bits received by the radio receiver of the hearing aid. The algorithm continues into step 310, where a test is carried out in order to determine if one hundred milliseconds have elapsed since a signal was detected by the radio receiver. If this is not the case, the algorithm loops back into step 309 and continues the process of decoding the data bits received by the radio receiver. Otherwise, the algorithm continues into step 311, where a test is carried out in order to determine if a radio signal is still present. If this is the case, the algorithm loops back into step 309 and continues the decoding process. If this is not the case, the algorithm instead loops back into step 302, where the radio receiver is put back into the idle mode, and continues to step 303, where the H-bridge is put back into the three-level mode.

The essence of the functionality of the algorithm shown in FIG. 3 is as follows: The radio receiver of the hearing aid is put into the idle mode and the H-bridge output stage of the hearing aid is put into the three-level mode for fifty milliseconds. Then the radio receiver listens for the presence of a radio signal while the H-bridge output stage is put into the two-level mode in order to minimize interference. If no signal has been detected by the radio receiver for a period of ten milliseconds, the radio receiver is put back into the idle mode and the H-bridge output stage is put back into the three-level mode in order to conserve power. However, if the radio receiver of the hearing aid detects the presence of a radio signal, reception and decoding of the received radio signal is commenced. Every 0.1 seconds a test is performed in order to determine if a radio signal is still present. If this is the case, the reception and decoding of the received radio signal continues. If a radio signal is no longer deemed to be present, the radio receiver is once again put back into the idle mode and the H-bridge output stage is put back into the three-level mode in order to conserve power.

Figure 4:
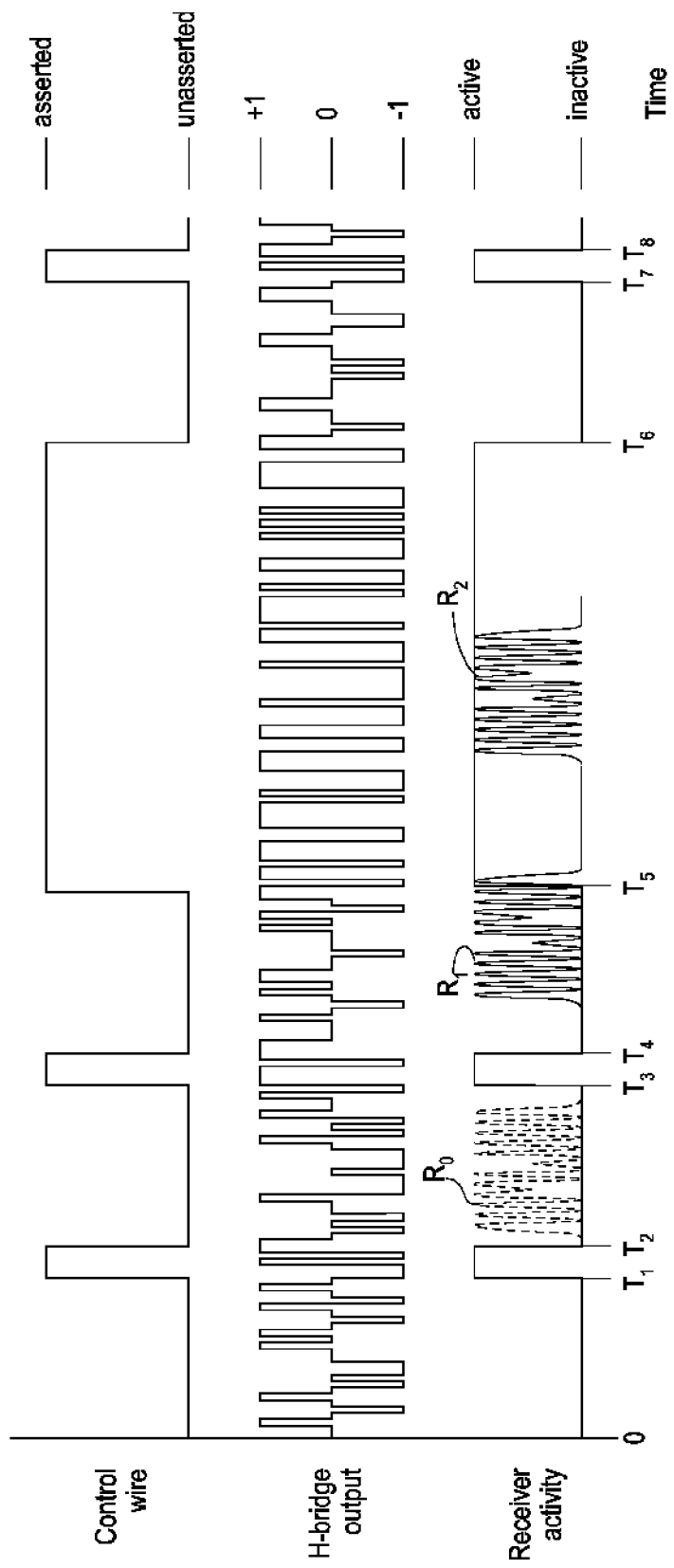
FIG. 4 is a graph illustrating the operating sequence of the output stage and the radio receiver of the hearing aid according to an embodiment of the invention.

FIG. 4 shows an exemplified set of graphs illustrating the interoperational characteristics between an output stage and a radio receiver in a hearing aid according to the invention. The upper graph in FIG. 4 illustrates the state of the control wire 14 of the controller 16 as shown in FIG. 1, the middle graph in FIG. 4 shows the output signal of the H-bridge 12 seen across the input terminals of the acoustic output transducer 19 in FIG. 1, and the lower graph in FIG. 4 shows the activity of the receiver 17 in FIG. 1 when controlled by the controllable switch 15 controlled by the control wire 14 of the controller 16 in FIG. 1. All three graphs are assumed to be synchronous.

The upper graph in FIG. 4 illustrates that the control wire 14 of FIG. 1 is asserted for short periods of time, thus enabling the radio receiver 17 in FIG. 1 and forcing the H-bridge output stage to operate in the two-level mode. Whenever the control wire is unasserted, the radio receiver is disabled and the H-bridge output stage is operated in the three-level mode. This is illustrated by the middle graph in FIG. 4, where an arbitrary output signal from the H-bridge output stage is exhibiting three-level operation when the control wire is unasserted and two-level operation when the control wire is asserted. The lower graph in FIG. 4 illustrates the operation of the receiver 17 in FIG. 1.

The operation of the output stage of the hearing aid according to the invention, as illustrated by the graphs in FIG. 4, will now be explained in further detail with reference to the elements shown in FIG. 1. Below the lower graph in FIG. 4 is suggested a timeline with eight time instants, labeled from $T_1$ to $T_8$. At the instant 0, the control wire 14 is unasserted, the radio receiver 17 is inactive, and the H-bridge output stage 1 is operating in the three-level output mode, delivering the three-level digital output signal directly to the acoustic output transducer 19 of FIG. 1.

At the instant $T_1$, the control wire 14 is asserted, and the H-bridge output stage 1 changes its operation from the three-level output mode to the two-level output mode. At the same time, the radio receiver 17 is activated. This condition persists until the instant $T_2$, approximately ten milliseconds later, where the control wire 14 is unasserted, the radio receiver 17 is inactivated, and the H-bridge output stage 1 is set to change its operation back into the three-level output mode. From the instant $T_2$ until the instant $T_3$, approximately fifty milliseconds later, the control wire 14 is unasserted, leaving the H-bridge in the three-level output mode and the radio receiver 17 inactive. In this case, a radio signal $R_0$, superimposed onto the lower graph of FIG. 4 in a dotted line, incidentally occurs between the instant $T_2$ and the instant $T_3$. Because the radio receiver 17 is in its inactive mode, the radio signal $R_o$ is not picked up by the radio receiver 17 of the hearing aid.

At the instant $T_3$, the radio receiver 17 is activated again by asserting the control wire 14, and the H-bridge output stage 1 changes its operation from the three-level output mode to the two-level output mode. Since no radio signal is detected by the radio receiver 17 between the instant $T_3$ and the instant $T_4$, the control wire 14 is unasserted at the instant $T_4$, approximately ten milliseconds later, when the radio receiver 17 is deactivated again, and the H-bridge output stage 1 has its operation changed back into the three-level output mode.

Between the instant $T_4$ and the instant $T_5$, another radio signal $R_1$, superimposed onto the lower graph of FIG. 4 in a thin, solid line, occurs, but since it is still present at $T_5$, it is detected by the radio receiver 17. The detection of the radio signal R1 by the radio receiver 17 makes the controller 16 keep the control wire 14 asserted, thus keeping the radio receiver 17 active and the H-bridge output stage 1 operating the two-level output mode. Within the time period between the instant $T_5$ and the instant $T_6$, a third radio signal $R_2$, superimposed onto the lower graph of FIG. 4 in a thin, solid line, is detected and decoded by the radio receiver 17. The radio receiver 17 keeps a reception flag asserted during reception of the radio signal $R_2$, and thus prevents the return of the radio receiver 17 to its inactive state. This, in turn, also delays the return of the H-bridge output stage 1 to the two-level output mode.

When the radio signal $R_2$ ceases, a timing function delays the unassertion of the control wire 14 for a predetermined period of time. As no other radio signal is detected before the instant $T_6$, the control wire 14 is unasserted again at $T_6$. Hereby the radio receiver 17 is inactivated, and the H-bridge output stage 1 changes its operation back to the three-level output mode. At the instant $T_7$, after approximately another fifty milliseconds, the radio receiver 17 is activated again by asserting the control wire 14, and the H-bridge output stage 1 changes its operation from the three-level output mode to the two-level output mode. The control wire 14 is unasserted again at the instant $T_8$, approximately ten milliseconds later, whereby the radio receiver 17 is deactivated again, and the H-bridge output stage 1 changes its operation back into the three-level output mode.

In order to demonstrate the operating principles of the H-bridge output stage according to an embodiment of the invention, the three bursts of radio transmission illustrated by the lower graph in FIG. 4 are shown as being rather short. This is done to illustrate, in as brief a way as possible, the fact that the radio receiver 17 is only capable of receiving radio signals when it is activated by the controller 16 of the hearing aid, and that the radio receiver 17 has the ability to delay a pending inactivation whenever a radio signal is encountered. In a practical example, radio transmissions intended for the hearing aid will be significantly longer, preferably spanning a considerably longer period of time than the sixty milliseconds shown elapsing between two activations of the radio receiver in the example.

Figure 5:
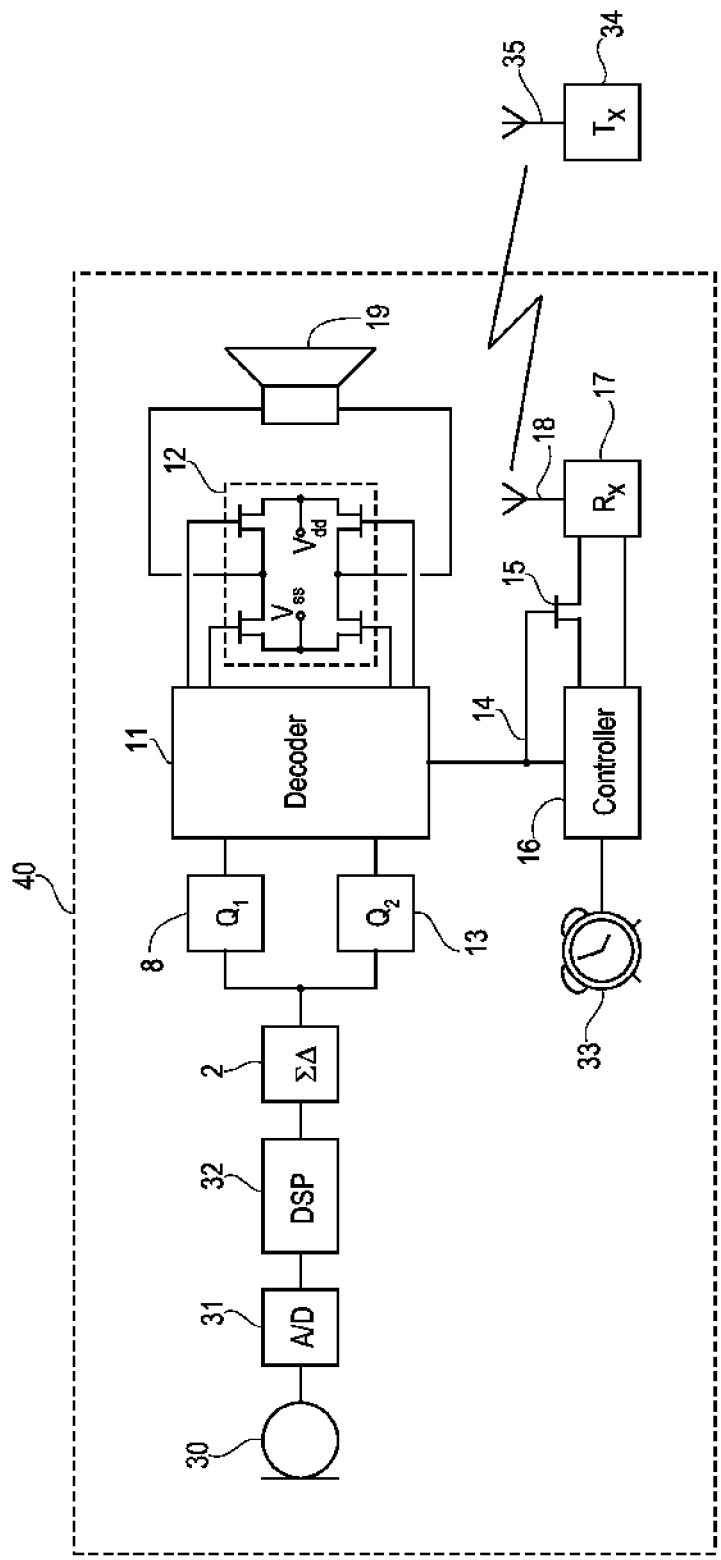
FIG. 5 is a schematic of a hearing aid having an H-bridge output stage according to an embodiment of the invention.

In FIG. 5 is shown a schematic of a hearing aid 40 incorporating an H-bridge output stage according to an embodiment of the invention. The hearing aid 40 comprises an acoustic input transducer 30, an analog-to-digital converter 31, a digital signal processor 32, a sigma-delta modulator 2, a first quantizer block 8, a second quantizer block 13, a decoder 11, an H-bridge 12, a controller 16, a control wire 14, a controllable switch 15, a timer 33, an acoustic output transducer 19, and a radio receiver 17 having an antenna 18. In FIG. 5 is also shown a radio transmitter 34 having an antenna 35. The sigma-delta converter 2, the decoder 11, the controller 16, the H-bridge 12, the acoustic output transducer 19 and the radio receiver 17 are considered to be similar to the corresponding parts of the system shown in FIG. 1.

When in use, the microphone 30 of the hearing aid 40 picks up acoustic signals and converts them into electrical signals and feeds the electrical signals to an input of the analog-to-digital converter 31. The digital output signal from the analog-to-digital converter 31 is used as the input for the digital signal processor 32, where the main part of the signal processing, e.g. filtering, compression, prescription gain calculation etc. takes place. The output signal from the digital signal processor 32 is a digital signal, which is fed to the input of the sigma-delta modulator 2.

The output signal from the sigma-delta modulator 2, which may be considered to be a digital bit stream, is split into two branches, one branch going to the first quantizing block 8, and the second branch going to the second quantizing block 13. The output signals from the first and second quantization blocks 8, 13, are presented as input signals to the decoder 11. The decoder 11 generates a set of control signals for the H-bridge 12. The output terminals of the H-bridge 12 are connected to the input terminals of the acoustic output transducer 19, and the H-bridge 12 generates a digital output signal for the acoustic output transducer 19.

The output signal from the first quantization block 8 is a two-level bit stream intended for driving the H-bridge 12 in a two-level mode via the decoder 11. The output signal from the second quantization block 13 is a three-level bit stream intended for driving the H-bridge 12 in a three-level mode via the decoder 11. The decoder 11 is thus capable of selecting either the output signal from the first quantization block 8 or the output signal from the second quantization block 13 as the input signal for generating the set of control signals for the H-bridge 12.

When the two-level output signal from the first quantization block 8 is used, the decoder 11 is said to be operating in a two-level mode, and when the three-level output signal from the second quantization block 13 is used, the decoder 11 is said to be operating in a three-level mode. The radio receiver 17 is capable of operating in an idle mode, wherein radio signal reception is suppressed, and in an active mode, wherein radio signal reception is enabled.

The controller 16 determines which mode the decoder 11 is supposed to be using in a given situation in order to generate the set of control signals for the H-bridge 12. For this purpose, the controller 16 utilizes information from the timer 33 and the radio receiver 17, respectively, to determine what the mode of operation for the decoder 11 should be. The timer 33 generates a timing sequence similar to the timing sequence shown in FIG. 4. This timing sequence is used by the controller 16 to control the operation of the decoder 11 and the radio receiver 17 of the hearing aid 40. During a first phase of the timing sequence, the timer 33 sends a signal to the controller 16 at regular intervals in order to make it change the operation of the radio receiver 17 from the idle mode to the active mode and force the decoder 11 to select the two-level bit stream from the first quantizer block 8 for the H-bridge 12 in order for it to operate in the two-level mode.

When the controller 16 determines that the radio receiver 17 should change its mode of operation from the idle mode to the active mode based on the signal from the timer 33, the controller 16 asserts the control wire 14 in order to engage the controlled switch 15 for activating the radio receiver 17. Simultaneously, the controller 16 forces the decoder 11, via the control wire 14, to select the two-level bit stream originating from the first quantizing block 8 for controlling the H-bridge 12. The radio receiver 17 is now in the active mode, and the H-bridge 12 is producing a two-level bit stream for the acoustic output transducer 19.

Unless the radio transmitter 34 transmits a radio signal which is picked up by the radio receiver 17 while it is in the active mode, the controller 16 waits for a signal from the timer 33 and unasserts the control wire 14 upon detecting the signal from the timer 33, thus disengaging the controlled switch 15, in turn forcing the radio receiver 17 back into the idle mode, and makes the decoder 11 select the three-level bit stream from the second quantizing block 13 for controlling the H-bridge 12. If, however, the radio transmitter 34 transmits a radio signal, and this radio signal is detected by the radio receiver 17, a signal is sent from the radio receiver 17 to the controller 16, informing the controller 16 to postpone signals from the timer 33 until the radio receiver 17 informs the controller 16 that it has finished receiving and decoding the radio signal.

The timer 33 now enters a second phase in the timing sequence, wherein the controller 16 regularly checks the status of the radio receiver 17 in order to determine that the radio receiver 17 is still receiving and decoding a radio signal. If this is the case, the controller maintains status quo, i.e. it keeps the H-bridge 12 operating in the two-level mode and keeps the radio receiver 17 in the active mode. When the radio transmitter 34 ends a transmission, the radio receiver 17 stops detecting a radio signal, and thus ends the decoding process. Upon terminating the decoding process, the radio receiver 17 sends a signal to the controller 16 in order to convey the information that reception of the radio signal has ended. Upon getting this piece of information, the controller 16 then waits for a signal from the timer 33 before deactivating the radio receiver 17 and forcing the H-bridge 12 into the three-level mode, producing a three-level bit stream to the acoustic output transducer 19.

In a preferred embodiment, the first phase of the timing sequence of the timer 33, as described in the foregoing, is considerably shorter than the second phase. This relationship between the two phases of the timing sequence is preferred because it allows the H-bridge 12 to operate for as long as possible in the power-saving three-level mode of operation during the first phase of the timing sequence, and prevents premature reentrance of the H-bridge 12 into the three-level mode of operation while the radio receiver 17 receives and decodes a radio signal, thus reducing the risk of the reception of the radio signal being corrupted by capacitive interference from the H-bridge 12.

I claim:

1. A method of driving an output stage for a hearing aid, said hearing aid having at least one input transducer, an analog-to-digital converter, a digital signal processor, a sigma-delta modulator, a first quantizing block, a second quantizing block, a decoder, an H-bridge output converter, an acoustic output transducer, a timer, a controller and a radio receiver, the radio receiver having an idle mode of operation and a listening mode of operation, said method comprising the steps of generating a driving signal in the sigma-delta modulator based on an output signal from the digital signal processor, processing, in the first quantizing block, using the sigma-delta modulator output signal to generate a first bit stream adapted for defining two discrete levels, processing, in the second quantizing block, using the sigma-delta modulator output signal to generate a second bit stream adapted for defining three discrete levels, the controller using the timer to execute a control sequence for enabling the decoder to select one bit stream among the first and the second bit streams and control an operating mode of the radio receiver, the decoder selecting the first bit stream whenever the radio receiver is in the listening mode, the decoder selecting the second bit stream whenever the radio receiver is in the idle mode, and providing a drive signal for the H-bridge output converter based on the selected bit stream.

2. The method according to claim 1, wherein the step of executing the control sequence includes a first phase having a first step, wherein the radio receiver is forced into the idle mode of operation, and the second bit stream is selected in the decoder as a control signal for the H-bridge output converter, and a second step, wherein the radio receiver is forced into the listening mode of operation and the first bit stream is selected in the decoder as a control signal for the H-bridge output converter.

3. The method according to claim 2, wherein the step of executing the control sequence includes a second phase having a first step being executed if the radio receiver is in the listening mode, sensing whether a radio signal is being received, and, in the affirmative, the controller maintaining the listening mode for a predetermined time period.

4. The method according to claim 3, wherein the second phase further includes a step of reentering said first phase if no radio signal is being received and wherein said step of reentering the first phase of the control sequence is delayed for a predetermined period, calculated from the moment the controller determines that no radio signal is being received.

5. The method according to claim 4, wherein the decoder selects the first bit stream as the control signal for the H-bridge output converter when the radio receiver is in the listening mode, and selects the second bit stream as the control signal for the H-bridge output converter when the radio receiver is in the idle mode.

6. A hearing aid having at least one input transducer, an analog-to-digital converter, a digital signal processor, a sigma-delta modulator, a first quantizing block, a second quantizing block, a decoder, an H-bridge output converter, an acoustic output transducer, a timer, a controller and a radio receiver, the radio receiver having an idle mode of operation and a listening mode of operation, the sigma-delta modulator being adapted for generating a driving signal based on an output signal from the digital signal processor, the first quantizing block being adapted for generating a first bit stream and the second quantizing block being adapted for generating a second bit stream based on the sigma-delta modulator output signal, the first bit stream incorporating two discrete levels and the second bit stream incorporating three discrete levels, the controller being adapted for enabling the decoder to select one bit stream among the first and the second bit streams and for controlling the operating mode of the radio receiver, wherein said controller is configured to make the decoder select the first bit stream whenever the radio receiver is in the listening mode, and make the decoder select the second bit stream whenever the radio receiver is in the idle mode.

7. The hearing aid according to claim 6, wherein the radio receiver indicates that radio signal reception is in progress.

8. The hearing aid according to claim 7, wherein the controller makes the radio receiver enter the listening mode periodically based on information from the timer.

9. The hearing aid according to claim 8, wherein the controller makes the radio receiver reenter the idle mode after a predetermined time period based on information from the timer.

10. The hearing aid according to claim 9, wherein the controller is configured to maintain the listening mode of the radio receiver whenever the radio receiver indicates the radio signal reception is in progress.

11. The hearing aid according to claim 6, wherein the decoder is configured to provide a drive signal for the H-bridge output converter based on the selected bit stream.

* * * * *